(12) United States Patent
Dietel

(10) Patent No.: US 11,614,351 B2
(45) Date of Patent: Mar. 28, 2023

(54) AUTOMATED CARTRIDGE-STYLE HYDRAULIC FLOW SENSOR

(71) Applicant: Dale Dietel, Waconia, MN (US)

(72) Inventor: Dale Dietel, Waconia, MN (US)

(*) Notice: Subject to any disclaimer, the term of this patent is extended or adjusted under 35 U.S.C. 154(b) by 156 days.

(21) Appl. No.: 17/146,918

(22) Filed: Jan. 12, 2021

(65) Prior Publication Data

US 2021/0310838 A1 Oct. 7, 2021

Related U.S. Application Data

(60) Provisional application No. 63/006,157, filed on Apr. 7, 2020.

(51) Int. Cl.
| | | |
|---|---|---|
| *G01F 1/11* | (2006.01) | |
| *G01F 1/115* | (2006.01) | |
| *G01L 19/00* | (2006.01) | |
| *G01F 15/00* | (2006.01) | |

(52) U.S. Cl.
CPC .......... *G01F 1/1155* (2013.01); *G01F 15/005* (2013.01); *G01L 19/0092* (2013.01)

(58) Field of Classification Search
None
See application file for complete search history.

(56) References Cited

U.S. PATENT DOCUMENTS

| | | | | |
|---|---|---|---|---|
| 3,701,277 A | * | 10/1972 | McMahon | G01F 15/066 73/861.87 |
| 4,566,317 A | * | 1/1986 | Shakra | E21B 47/10 73/152.35 |
| 7,624,632 B1 | * | 12/2009 | Hoyle | G01F 1/6847 73/204.11 |
| 2003/0074984 A1 | * | 4/2003 | Peterson | G01F 1/075 73/861.77 |
| 2012/0325016 A1 | * | 12/2012 | Peled | G01F 1/115 73/273 |

* cited by examiner

*Primary Examiner* — Lisa M Caputo
*Assistant Examiner* — Nigel H Plumb
(74) *Attorney, Agent, or Firm* — Edwin E. Voigt, II

(57) ABSTRACT

A cartridge-style flow sensor for sensing fluid flow. The flow sensor includes an exterior, interior, head, base, a circuit board, and first and second ports. The first and second ports permit fluid to flow into and out of the interior. A Hall Effect Sensor in the interior detects the number of revolutions of an impeller. An electric coupler interfaces with the sensor and a transmitter for communication of the revolutions of the impeller to a controller. The controller determines the rate of fluid flow in a conduit. The controller automatically issues a command signal to a component of a hydraulic system to alter the rate of fluid flow in the conduit. The cartridge-style hydraulic flow sensor is releasably engaged to a cavity of a hydraulic circuit manifold eliminating the need to cut and re-plumb a fluid conduit.

17 Claims, 6 Drawing Sheets

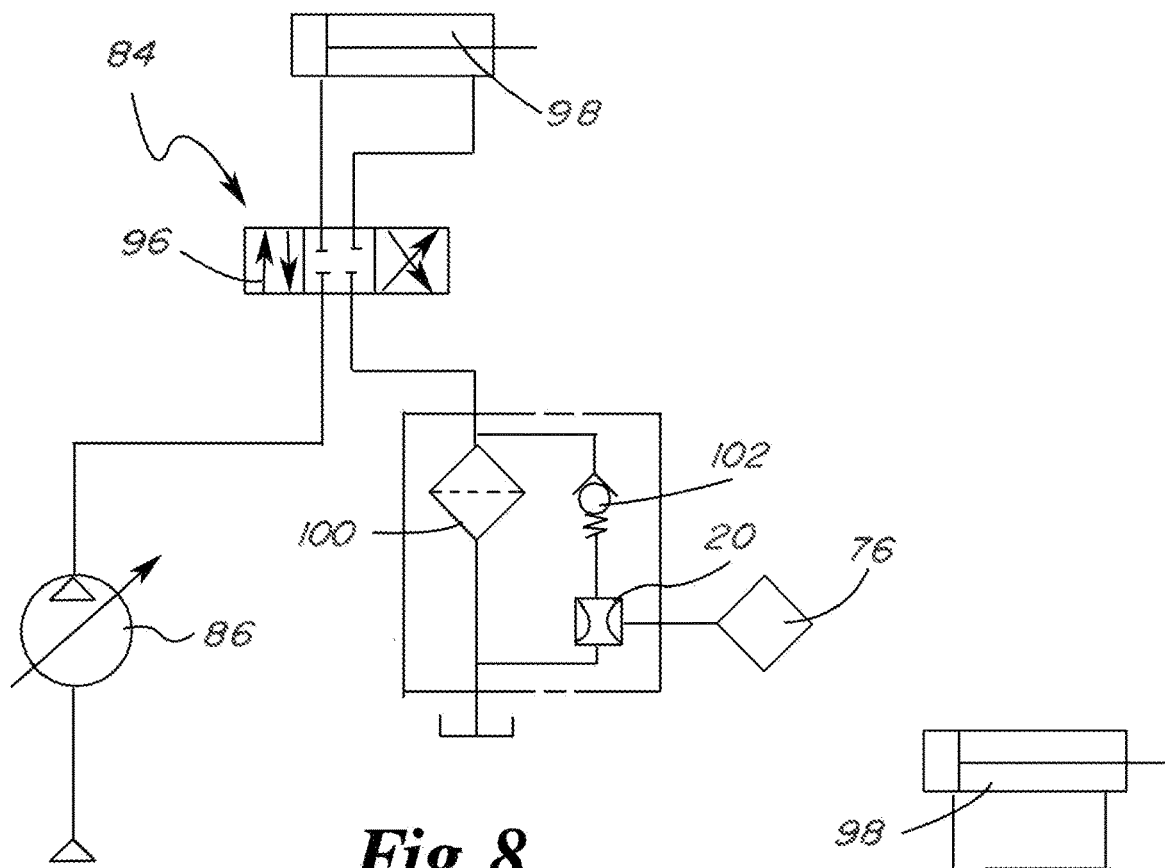
*Fig.8*
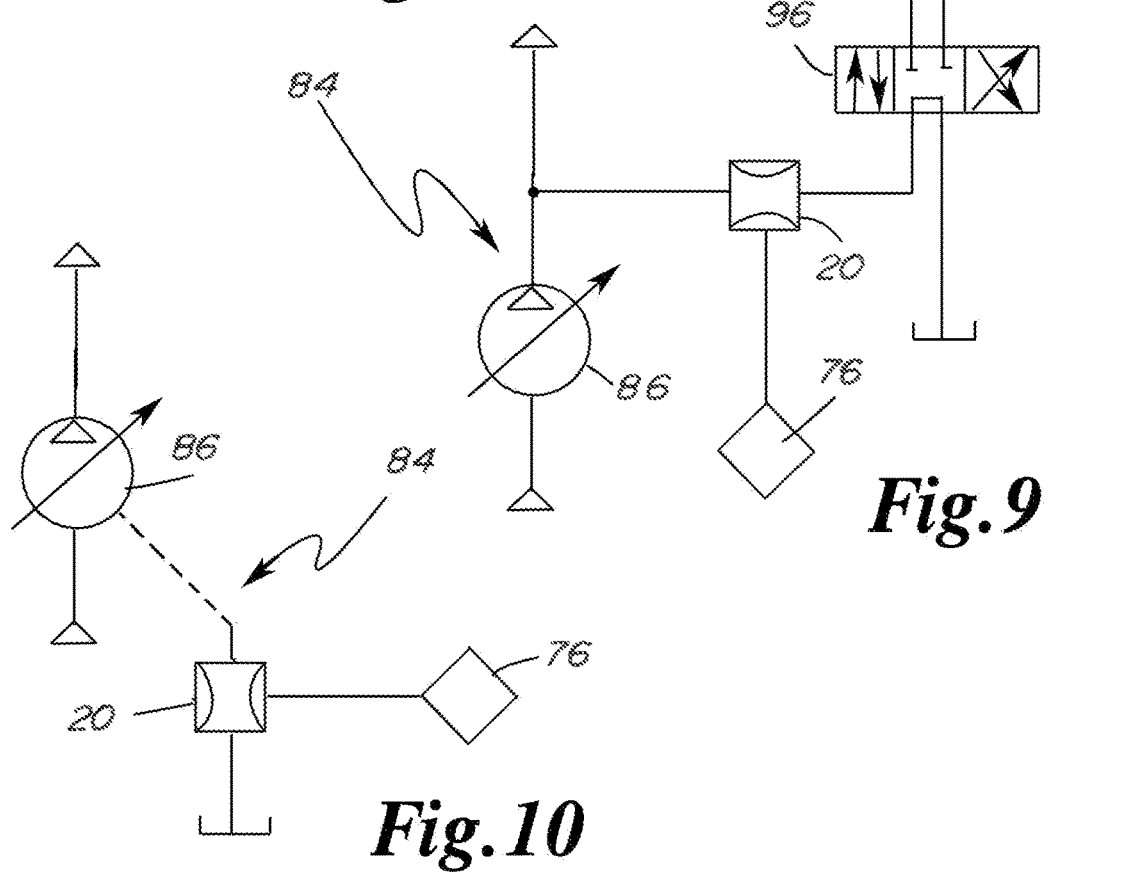
*Fig.9*
*Fig.10*

AUTOMATED CARTRIDGE-STYLE HYDRAULIC FLOW SENSOR

CROSS-REFERENCE TO RELATED APPLICATIONS

This application claims the benefit of U.S. Provisional Patent Application Ser. No. 63/006,157 filed Apr. 7, 2020, which is incorporated by reference herein in its entirety.

FIELD OF THE INVENTION

The invention is directed to a cartridge style hydraulic flow sensor for engagement into, and for removal from, a hydraulic circuit manifold. The cartridge style hydraulic flow sensor may be electrically engaged to and in communication with a controller and/or processor to monitor fluid flow through a hydraulic circuit manifold. The cartridge style hydraulic flow sensor assists the controller in the automatic adjustment of a setting of a pumping or hydraulic system to provide for a desired volume of liquid flowing through the hydraulic circuit manifold.

BACKGROUND

In the past hydraulic flow sensors have been difficult to incorporate into a hydraulic system. In the past a hydraulic line has been required to be cut and a hydraulic flow sensor sealed within the artificially created gap within the hydraulic line. The insertion of a hydraulic flow sensor within a hydraulic line naturally required labor intensive activities as well as skill to plumb the hydraulic flow sensor into the hydraulic line while maintaining the integrity of the hydraulic line and preventing leakage of fluid.

Simultaneously with the modification to an existing hydraulic line, wires were required to be added proximate to the hydraulic line so that communication would be established between the inserted hydraulic sensor and a display unit and control unit. The display unit frequently included components to translate the fluid flow rate into an analog or digital signal. However, adjustment to the flow within a hydraulic system required an individual to manipulate a hydraulic system control unit on a different control panel in order to effectuate a change in the rate of fluid flow within the hydraulic system.

Another problem with the known prior art was the difficulties to maintain and/or replace a conventional hydraulic flow sensor which had been previously plumbed into a hydraulic line. In the past to maintain or replace a hydraulic flow sensor an individual was required to cut an existing hydraulic flow sensor out of an existing hydraulic line in order to access, reconfigure, repair and/or replace the non-performing or defective hydraulic flow sensor.

In addition to the drawbacks identified above, no known hydraulic flow sensor exists which is easily engaged or disengaged from a hydraulic circuit manifold and which simultaneously provides communication with a controller/processor which may sense fluid flow and performance within a hydraulic line or hydraulic system and which may automatically adjust the hydraulic system to provide a desired level of performance.

The art referred to and/or described above is not intended to constitute an admission that any patent, publication or other information referred to herein is "prior art" with respect to this invention. In addition, this section should not be construed to mean that a search has been made or that no other pertinent information as defined in 37 C.F.R. § 1.56(a) exists.

All U.S. patents and applications and all other published documents mentioned anywhere in this application are incorporated herein by reference in their entireties.

Without limiting the scope of the invention, a brief description of some of the claimed embodiments of the invention is set forth below. Additional details of the summarized embodiments of the invention and/or additional embodiments of the invention may be found in the Detailed Description of the Invention below.

A brief abstract of the technical disclosure in the specification is provided for the purposes of complying with 37 C.F.R. § 1.72.

GENERAL DESCRIPTION OF THE INVENTION

In at least one embodiment, the cartridge style hydraulic flow sensor is conveniently inserted within and/or removed from a hydraulic circuit manifold. The cartridge style hydraulic flow sensor is simultaneously easily coupled to a controller/processor used to monitor the operational performance of a hydraulic fluid circuit. A pump or other component may be automatically adjusted after the operational performance of the hydraulic system is determined based on information received from the cartridge style hydraulic flow sensor.

In some embodiments, the cartridge style hydraulic flow sensor includes an impeller engaged to a shaft. A sensing element may be proximate to the impeller in order to detect the revolutions of the impeller over a period of time. The sensing element may include magnets. A Hall Effect Sensor may be in communication with a programmable logic controller for a hydraulic system or machine. The programmable logic controller may analyze the sensed rotations of the impeller and automatically adjust the flow rate of fluid passing through a fluid conduit and hydraulic circuit manifold.

In at least one embodiment, the cartridge style hydraulic flow sensor is bidirectional, and may sense fluid passage from opposite directions when engaged to a hydraulic circuit manifold.

In some embodiments, the cartridge style hydraulic flow sensor may be engaged to a hydraulic circuit manifold from a vertical or horizontal direction, or from any desired angle.

In some embodiments, the impeller may be engaged to a shaft which in turn is engaged to a gear. A Hall Effect Sensor may be used to sense, record and communicate the revolutions of the gear in order to determine the status and/or performance of a hydraulic system.

In at least one embodiment, the programmable logic controller may be in communication with a remotely located processor/controller which may interface with an operator of a hydraulic system or machine. The remotely located processor/controller may be in communication with pumps, fluid sources, valves or other components of a hydraulic system or machine to manually or automatically adjust the operational parameters of the hydraulic system or machine.

In at least one embodiment, the cartridge style hydraulic flow sensor includes an interior, at least one inlet port, and at least one outlet port. The impeller may be positioned proximate to and between the inlet port and the outlet port.

In at least one embodiment, the cartridge style hydraulic flow sensor includes a rotational detector and a rotational transmitter being in communication with either a programmable logic controller or a remotely located processor/controller.

In at least one embodiment, the rotational transmitter will be in communication with either a programmable logic controller and/or a remotely located processor/controller through a hardwire connection or through the use of Bluetooth or Wi-Fi.

In some embodiments, the cartridge style hydraulic flow sensor may be inserted into and engaged within a hydraulic circuit manifold, or may be placed within a hydraulic fluid line.

In at least one embodiment, the cartridge style hydraulic fluid sensor may include a check valve limiting fluid flow to a single direction.

These and other embodiments which characterize the invention are pointed out with particularity in the claims annexed hereto and forming a part hereof. However, for further understanding of the invention, its advantages and objectives obtained by its use, reference should be made to the drawings which form a further part hereof and the accompanying descriptive matter, in which there is illustrated and described embodiments of the invention.
Various other objects, features and attendant advantages of the present invention will become fully appreciated as the same becomes better understood when considered in conjunction with the accompanying drawings, in which like reference characters designate the same or similar parts throughout the several views, and wherein:

BRIEF DESCRIPTION OF THE DRAWINGS

FIG. 8 is a schematic diagram of one alternative embodiment of the cartridge style hydraulic flow sensor within a hydraulic system;

FIG. 9 is a schematic diagram of one alternative embodiment of the cartridge style hydraulic flow sensor within a hydraulic system;

FIG. 10 is a schematic diagram of one alternative embodiment of the cartridge style hydraulic flow sensor within a hydraulic system.

DETAILED DESCRIPTION OF THE PREFERRED EMBODIMENTS

Figure 5:
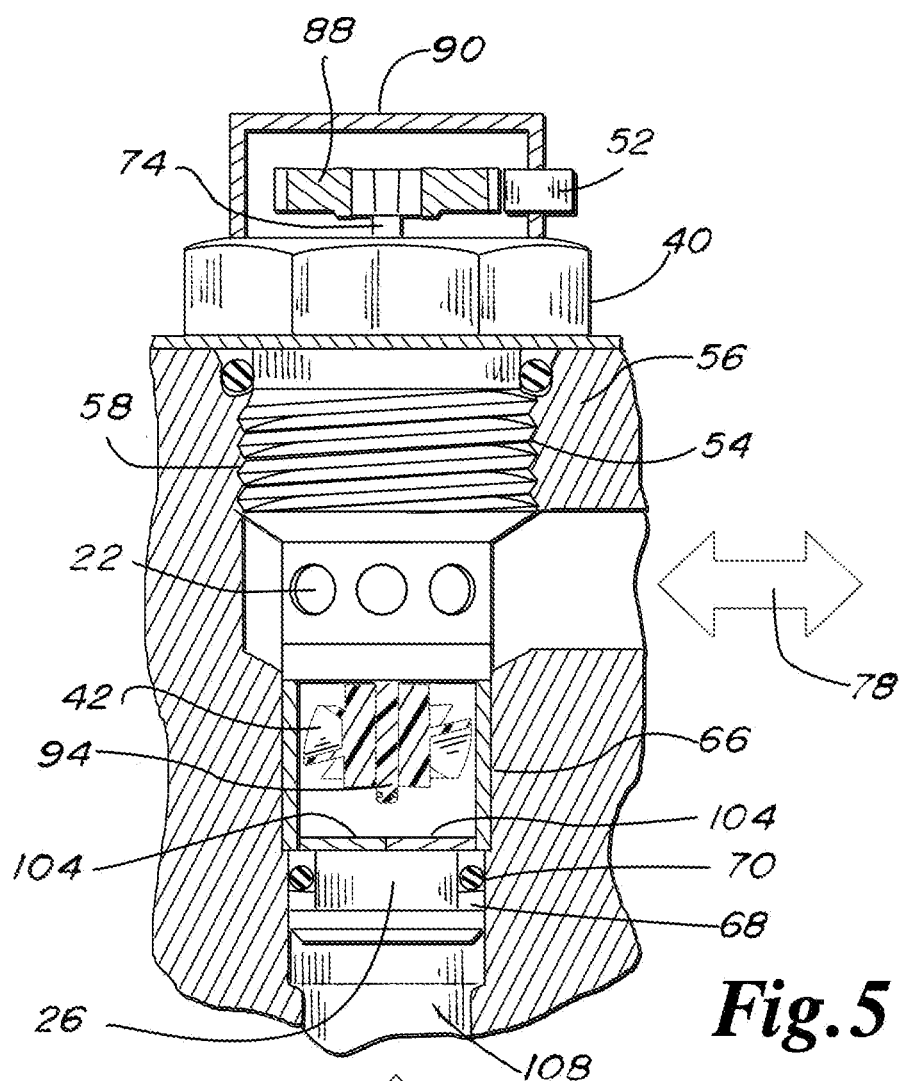
FIG. 5 is an alternative cross-sectional side view of one embodiment of the cartridge style hydraulic flow sensor taken along the line 2-2 of FIG. 1, as engaged to a hydraulic circuit manifold.
Figure 7:
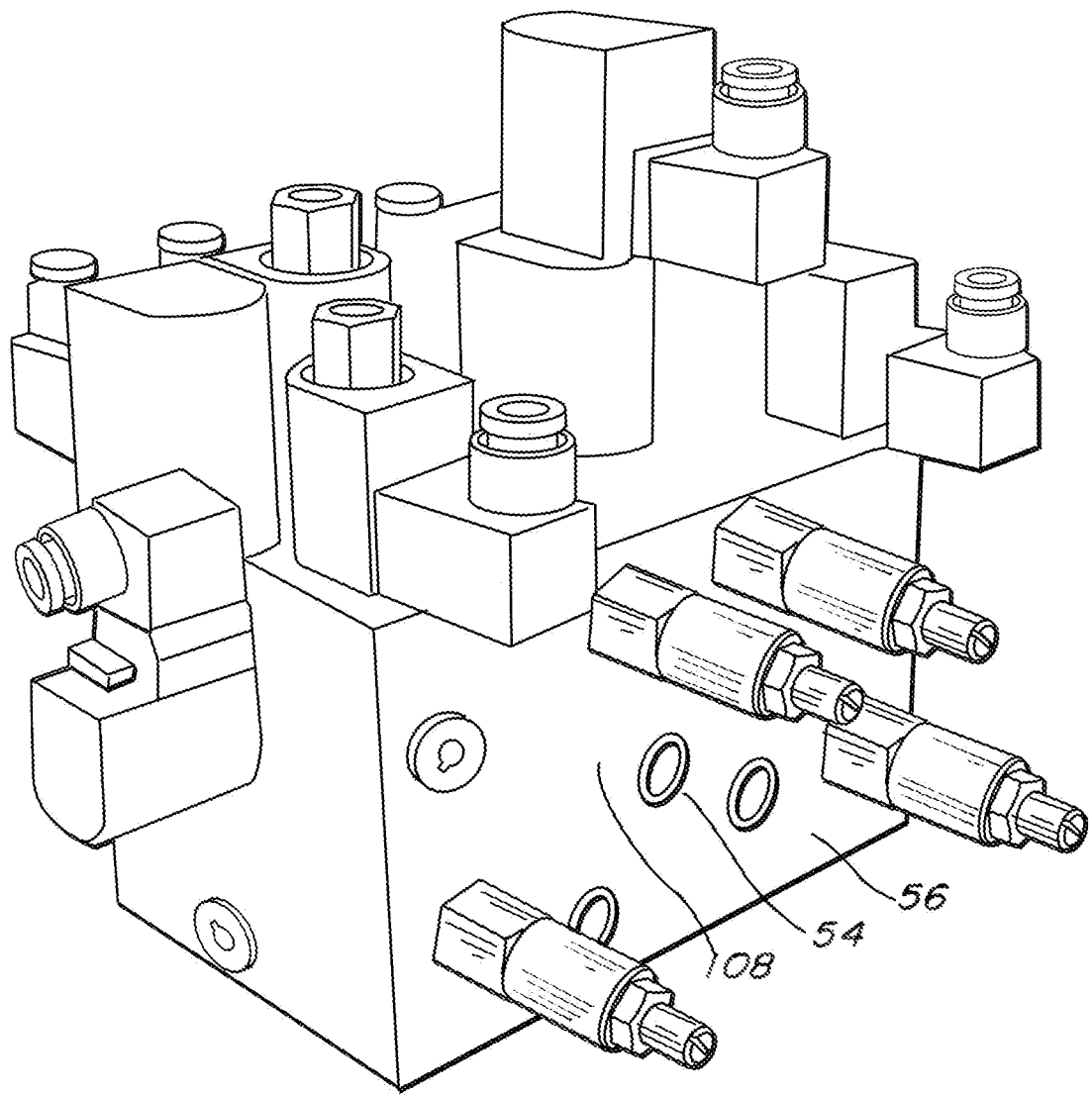
FIG. 7 is a perspective view of one alternative embodiment of the cartridge style hydraulic flow sensor engaged to a hydraulic circuit manifold.

Referring to FIG. 1 through FIG. 4 the cartridge style hydraulic flow sensor is in general referred to by reference numeral 20. The cartridge style hydraulic flow sensor 20 is preferably releasably coupled to a cavity 54 of a hydraulic circuit manifold 56. (FIG. 5 and FIG. 7).

In at least one embodiment, the cavity 54 includes internal threads proximate to the outer surface of the hydraulic circuit manifold 56. The cartridge style hydraulic flow sensor 20 includes mating threads 58 which engage the threads of the cavity 54 to secure the cartridge style hydraulic flow sensor 20 within the hydraulic circuit manifold 56.

In an alternative embodiment, the interior of the cavity 54 is a smooth bore and does not include any internal threads. In this embodiment, the cartridge style hydraulic flow sensor 20 may be inserted within the cavity 54 and may be secured within the cavity 54 through the use of a cap. The cap may be threaded or otherwise affixed to the exterior of the hydraulic circuit manifold 56 covering the top of the cartridge style hydraulic flow sensor 20.

In at least one embodiment, the cartridge style hydraulic flow sensor 20 includes a body 40 which is exterior to the hydraulic circuit manifold 56 following engagement of the cartridge style hydraulic flow sensor 20 within the cavity 54. The body 40 may be used to tighten the engagement between the mating threads 58 and the internal threads of the cavity 54.

In at least one embodiment, a head 60 extends upwardly from the body 40. The head 60 preferably includes a circular ledge 62 descending from the upper surface of the head 60 downwardly towards the body 40. The circular ledge 62 preferably receives a platform 50 which may be releasably secured to the head 60 by the use of a mechanical fastener, one example of which is a screw.

In one embodiment, the platform 50 includes a electronic coupler 64 which preferably includes power/communication leads 72 and a transmitter 38.

In one alternative embodiment, a cylindrical casing 66 extends downwardly from the body 40 and mating threads 58 towards a base 68. The base 68 may include a groove receiving an elastic base O-ring 70. An upper portion of the cylindrical casing 66 preferably includes a plurality of outlet fluid conduits 22. In some embodiments the outlet fluid conduits 22 pass through the cylindrical casing 66 above the impeller 42.

In at least one embodiment, fluid enters the cartridge style hydraulic flow sensor 20 from below or proximate to the base 68 as represented by arrow 78. The fluid moves upwardly within cylindrical casing 66 past impeller 42 and exits the cartridge style hydraulic flow sensor 20 through the plurality of outlet fluid conduits 22 and into a fluid conduit within the hydraulic circuit manifold 56.

In an alternative embodiment, the outlet fluid conduits 22 may be in inlet fluid conduit when liquid enters the cartridge style hydraulic flow sensor 20 in an opposite direction as related to arrow 78. The fluid will then exit the cartridge style hydraulic flow sensor 20 proximate to base 68.

Figure 1:
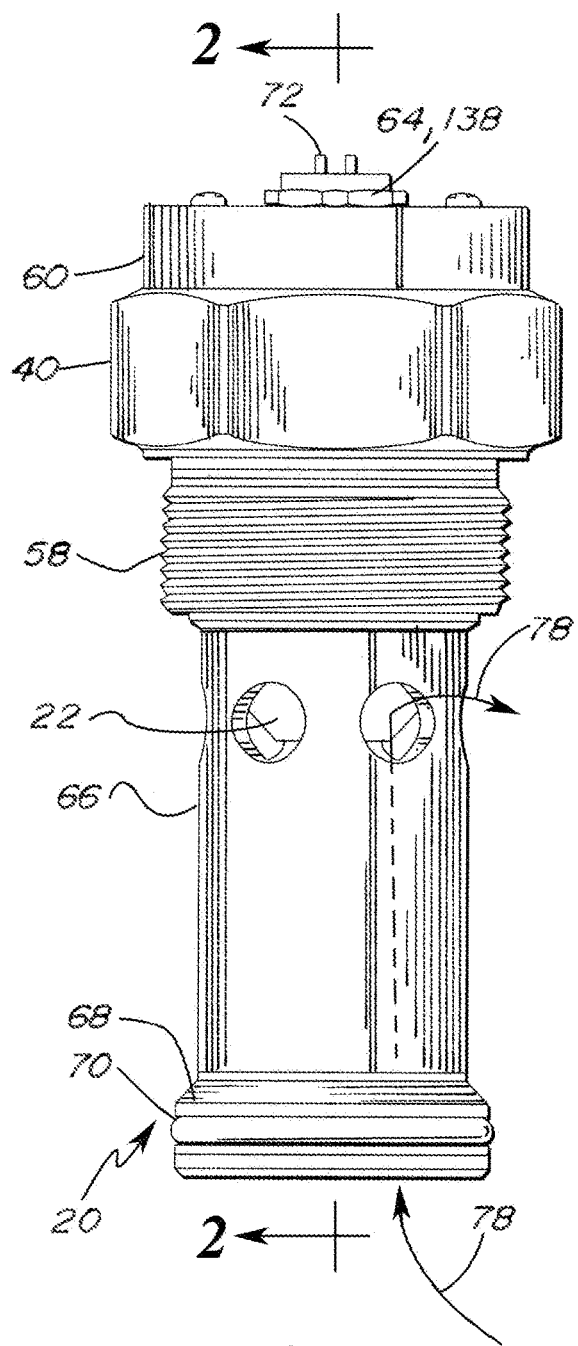
FIG. 1 is a side elevation view of one alternative embodiment of the cartridge style hydraulic flow sensor.
Figure 2:
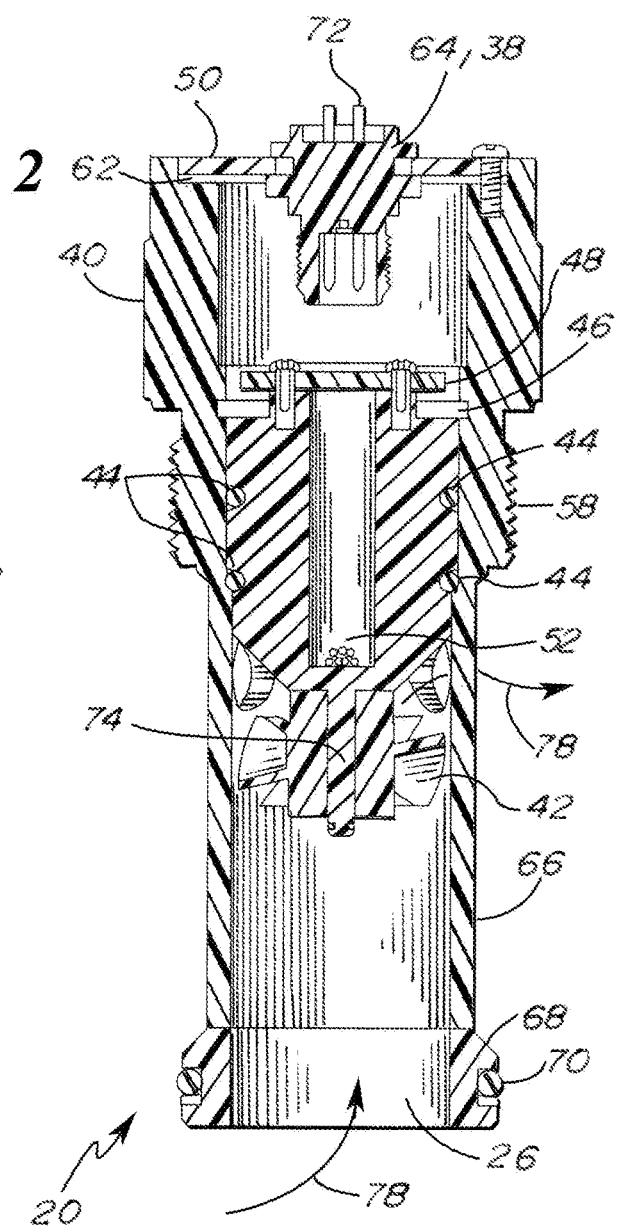
FIG. 2 is a cross-sectional side view of one alternative embodiment of the cartridge style hydraulic flow sensor taken along the line 2-2 of FIG. 1.

With reference to FIG. 2, the electronic coupler 64 extends downwardly from the top of head 60 into the interior of the cartridge style hydraulic flow sensor 20. The leads 72 extend downwardly for engagement to a circuit board 48 which may be a printed circuit board including a programmable logic controller.

In at least one embodiment, the circuit board 48 is positioned above, and is in communication with a Hall Effect Sensor 52. A shaft 74 preferably extends downwardly from the Hall Effect Sensor 52 towards the base 68. An impeller 42 is preferably rotatably engaged to the shaft 74. The impeller 42 preferably includes a plurality of shaped fins or blades which freely rotate relative to the shaft 74 upon exposure to a passing fluid flow. In one embodiment, the impeller 42 may include internal bearings for engagement to the shaft 74, to facilitation free rotation between the impeller 42 and shaft 74.

In at least one embodiment, at least one of the shaped fins or blades of the impeller 42 include or are embedded with a magnetic material. Rotation of the impeller 42 is sensed by the Hall Effect Sensor 52 where the Hall Effect Sensor 52 counts the revolutions of the impeller 42 during a pre-established period of time. The counted revolutions of the impeller 42 are communicated from the Hall Effect Sensor 52 to the circuit board 48. Circuit board 48 will then receive, analyze, and compare the number of revolutions of the impeller 42 to pre-stored data of impeller revolutions, for communication to a remote controller/processor 76 having an interface with an operator. Alternatively, the circuit board 48 may activate the transmitter 38 for re-communication of the sensed impeller revolutions for processing and analysis at the remote controller/processor 76.

In at least one embodiment, one or more O-rings 44 may be placed into grooves in the exterior surface of the Hall Effect Sensor 52. The O-rings 44 assist to establish a fluid seal between the Hall Effect Sensor 52 and the interior surface of the cylindrical casing 66, or the mating threads 58. In one embodiment, the base O-ring 70 is used to establish a fluid seal between the base 68 and the interior surface of a cavity 54.

Figures 3, 4:
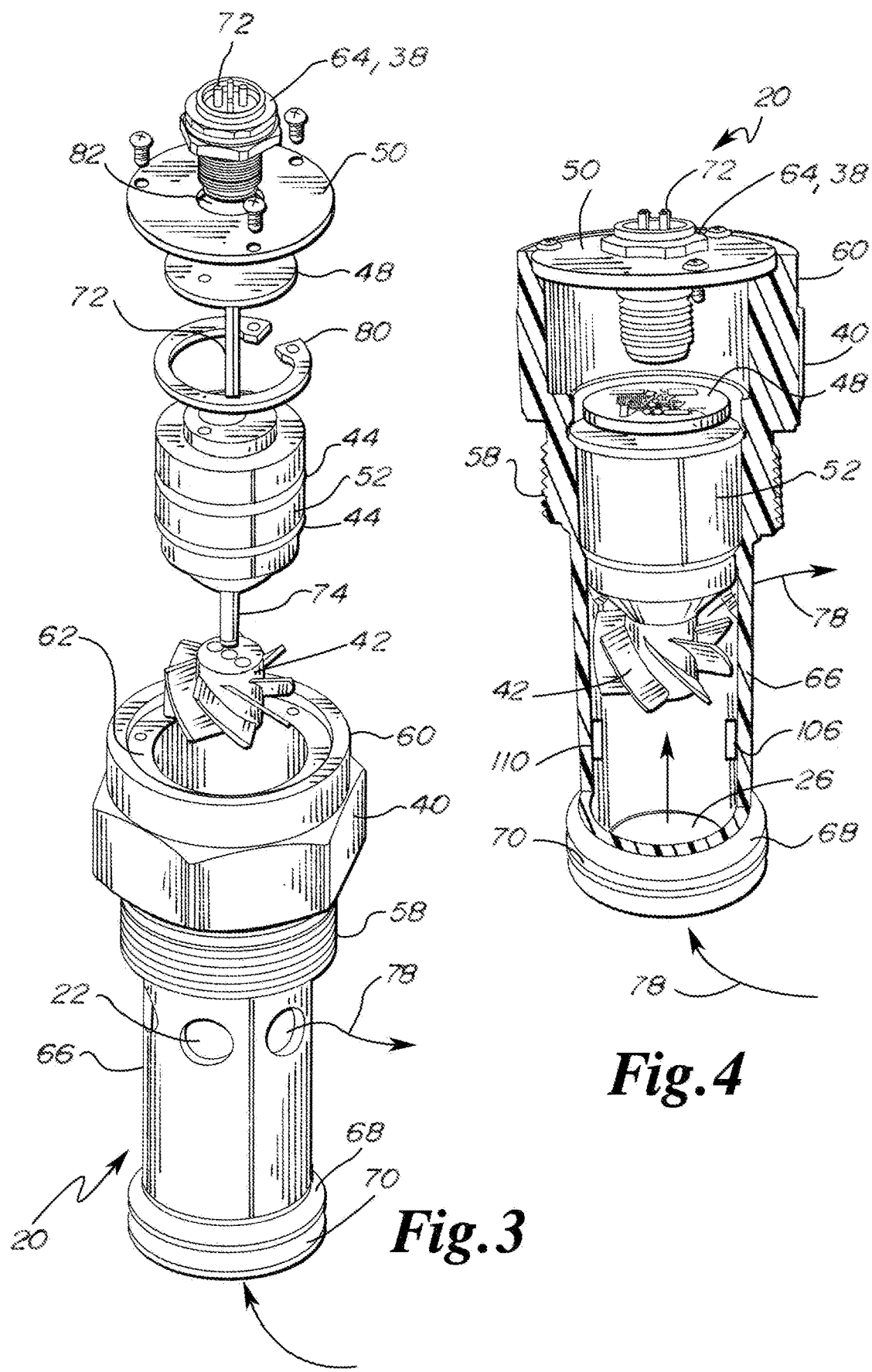
FIG. 3 is an exploded perspective view of one alternative embodiment of the cartridge style hydraulic flow sensor.
FIG. 4 is a cut-away view of one alternative embodiment of the cartridge style hydraulic flow sensor.

In at least one embodiment, as shown in FIG. 3, a positioning ring 80 may be located between the top of the Hall Effect Sensor 52 and the bottom of the platform 50 in surrounding engagement relative to the circuit board 48. FIG. 3 also shows that platform 50 has an central opening 82 which receives the electronic coupler 64.

In at least one embodiment, the cartridge style hydraulic flow sensor 20 is formed of an exterior structure which includes the head 60, circular ledge 62, body 40, mating threads 58, cylindrical casing 66 and base 68. An interior assembly is formed of the electronic coupler 64, platform 50, circuit board 48, Hall Effect Sensor 52, shall 74 and impeller 42. The interior assembly is preferably positioned within the interior of the exterior structure, and is secured to the exterior structure by a plurality of mechanical fasteners which may be screw s passing through the platform 50 and into the head 60.

In one embodiment as depicted in FIG. 3, the electric/communication leads 72 extend from the electronic coupler 64 to the circuit board 48. The circuit board 48 may also be in communication with the transmitter 38 which is used to communicate information or data to the remote controller/processor 76. In some embodiments, the impeller 42 is rotatably disposed on a shaft 74 where the impeller 42 is adjacent to the Hall Effect Sensor 52. In other embodiments, the shaft 74 may have an increased length dimension separating the impeller 42 from the bottom of the Hall Effect Sensor 52 by a desired dimension.

Referring to FIG. 4, the cartridge style hydraulic flow sensor 20 is shown with a portion of the head 60, body 40, mating threads 58 and cylindrical casing 66 cut away to show the impeller 42. Hall Effect Sensor 52, circuit board 48 and electronic coupler 64. As shown in FIG. 4 the impeller 42 is adjacent to the bottom of the Hall Effect Sensor 52.

In at least one embodiment, the impeller 42 may freely rotate about shaft 74 in either a clockwise or counterclockwise direction dependent on the direction of the fluid flow within a hydraulic circuit manifold 56. The direction of the revolution of the impeller 42 on the shaft 74 may alternatively be dependent upon the initial direction or orientation selected for the blades or fins.

In at least one embodiment, the cartridge style hydraulic flow sensor 20 is not required to couple to the hydraulic circuit manifold 56 in a vertical orientation. The cartridge style hydraulic flow sensor 20 may also be coupled to the hydraulic circuit manifold 56 in a horizontal direction, or an angular direction relative to either a vertical or a horizontal direction to sense fluid flow passage through a fluid conduit within the hydraulic circuit manifold 56.

The hydraulic circuit manifold 56 may be simple or very complex. In some embodiments the hydraulic circuit manifold 56 may include any number of valves 96, outlet fluid conduits 22, or inlet fluid conduits 26 and/or internal fluid flow conduits as required for a particular application. A cartridge style hydraulic flow sensor 20 may be in fluid flow communication within any desired conduit of a hydraulic system 84.

Fluid within the hydraulic circuit manifold 56 may flow upwardly as represented by arrow 78, contacting and rotating the blades or fins of the impeller 42, and then passing outwardly through the outlet fluid conduit 22 into a fluid flow conduit of the hydraulic circuit manifold 56.

As shown in FIG. 4 the circuit board 48 and transmitter 38 are proximate to the electronic coupler 64 and leads 72. In addition, the circuit board 48 is also proximate to the top of the Hall Effect Sensor 52.

In at least one embodiment, the Hall Effect Sensor 52 is connected electrically and is in communication with the circuit board 48 and transmitter 38. The circuit board 48 and transmitter 38 are also electrically connected and are in communication with the electronic coupler 64. The electronic coupler 64 through the use of the leads 72 is electrically connected and is in communication with an electrical power source and a remote controller/processor 76. The remote controller/processor 76 receives from circuit board 48 the sensed or calculated revolutions of the impeller 42 over the period of time.

The remote controller/processor 76 then performs an analysis of the received revolutions of the impeller 42 over the period of time, and inserts the number of revolutions of the impeller 42 into an equation for processing. The remote controller/processor 76 may also compare the received revolutions of the impeller 42 against pre-stored data. The remote controller/processor 76 determines the operational state of a hydraulic system 84. In general, the hydraulic system 84 will at least include a hydraulic circuit manifold 56 as well as a cartridge style hydraulic flow sensor 20 and a pump 86.

In some embodiments, the hydraulic circuit manifold 56 may receive a communication or command signal from a remote controller/processor 76 which in turn may open or close one of a plurality of valves 96 in communication with fluid flow conduits within the hydraulic circuit manifold 56. The communication between the cartridge style hydraulic flow sensor 20 and the remote controller/processor 76 enables an operator to determine if an adjustment is required to be made to the operational parameters of the pump 86 to increase or decrease the rate or volume of liquid flow entering the hydraulic circuit manifold 56 to be sensed by the cartridge style hydraulic flow sensor 20. The pump 86 is also electrically connected and is in communication with the remote controller/processor 76. The remote controller/processor 76 in turn may adjust a setting on the pump 86 in response to information received from the cartridge style hydraulic flow sensor 20 related to a fluid flow rate within the hydraulic circuit manifold 56.

The remote controller/processor 76 is not restricted to communications between the cartridge style hydraulic flow sensor 20 or hydraulic circuit manifold 56 and pump 86. The remote controller/processor 76 may additionally be in communication with any other elements of an hydraulic system 84 or other elements of a system or structure or machine which may be capable of regulation, control, adjustment, initiation and/or termination, to name a few. In addition, the remote controller/processor 76 may be in communication, and may monitor all functions of a hydraulic system 84 in real time, including but not necessarily limited to valves, flow meters and sensors. Further, the remote controller/processor 76 may include artificial intelligence software which is used to automatically issue command signals to components capable of control within a hydraulic system 84 to maximize fluid flow within the hydraulic system 84.

In at least one alternative embodiment, the communication between the cartridge style hydraulic flow sensor 20 through the electronic coupler 64 to the remote controller/processor 76 will occur through a wired connection. Alternatively, the connection through the electronic coupler 64 to the remote controller/processor 76 may pass initially to an intermediate communication hub through a wired connection, and then may be retransmitted by the intermediate medication hub to the remote controller/processor 76 through a wired connection or through a wireless connection such as through Bluetooth or Wi-Fi.

In an alternative embodiment, the electronic coupler 64 will include wireless communication capabilities for communication directly to the remote controller/processor 76 through a wireless media such as Bluetooth or Wi-Fi or by use of another wireless communication medium. In an alternative embodiment, the electronic coupler 64 may transmit a wireless communication to an intermediate communication hub. The intermediate communication hub may than re-transmit the communication to the remote controller/processor 76 through a wireless transmission or through a wired connection at the preference of an individual.

In an alternative embodiment, as shown in FIG. 5, the impeller 42 is engaged to the shaft 74. The shaft 74 extends upwardly traversing the top of the cartridge style hydraulic flow sensor 20 terminating with a connection to a gear 88. The rotation of the impeller 42 in response to fluid flow within the fluid flow conduit of the hydraulic circuit manifold 56 is translated to the rotation of the gear 88. It should be noted that the gear 88 may rotate in either a clockwise or counterclockwise direction resulting from the factors as earlier described.

In this alternative embodiment, at least one portion of the gear 88 includes magnetic material which will pass a Hall Effect Sensor 52 which is positioned proximate to the gear 88. The Hall Effect Sensor 52 will signal the rotations of the gear 88 relative to the Hall Effect Sensor 52 for communication to the circuit board 48 and transmitter 38, and for transmission to the remote controller/processor 76 through any of the alternative communication methods earlier described.

In the alternative embodiment depicted in FIG. 5, a cover 90 may be securely positioning covering relationship relative to the gear 88 in order to protect against any object or condition interfering with the free rotation of the gear 88.

Figure 6:
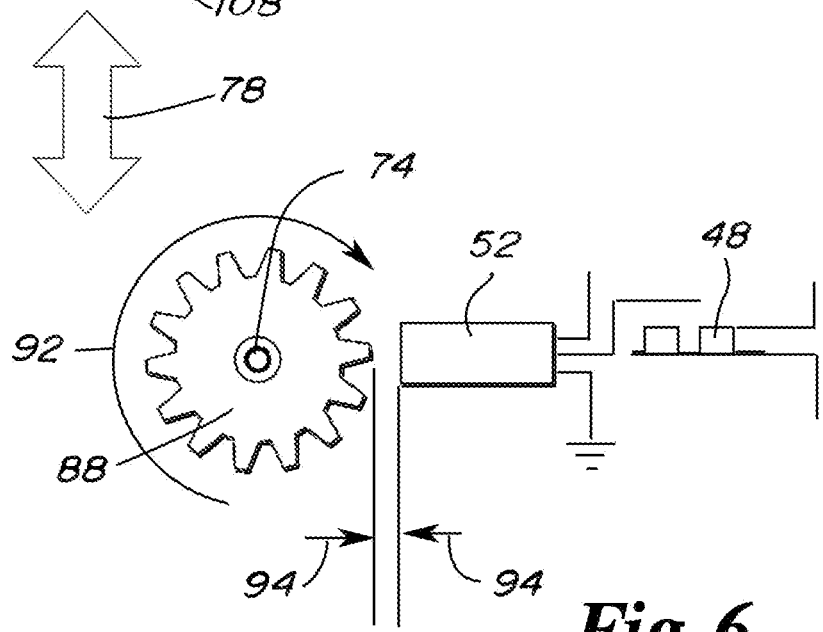
FIG. 6 is a detail schematic diagram of one embodiment of a gear in communication with a Hall Effect Sensor of the cartridge style hydraulic flow sensor.

In an alternative embodiment depicted in FIG. 5 and FIG. 6, the rotation of the rotation of the gear 88 as connected to the shaft 74 and impeller 42 is represented by arrow 92. The separation of the gear 88 from the Hall Effect Sensor 52 enables the free rotation of the gear 88 relative to the sensor. It should be noted that gear 88 may be separated from Hall Effect Sensor 52 by any desired distance dependent on materials and size dimensions selected to form the gear 88, and the magnetic material integrated into the gear 88.

In at least one embodiment as depicted in FIG. 5, the cartridge style hydraulic flow sensor 20 includes a check valve 104 within the interior of the cylindrical casing 66. The check valve 104 functions to restrict the direction of fluid flow inwardly from the exterior of the base 68 towards the impeller 42 as depicted by reference numeral arrow 78. Alternatively, the check valve 104 functions to restrict the direction of fluid flow outwardly from the interior through the base 68 away from the impeller 42 as depicted by a direction opposite to reference numeral arrow 78. The check valve 104 will limit the direction of fluid flow to a single direction during use at any given time. In order to restrict the direction of fluid flow to an opposite direction, then the orientation of the check valve 104 will be required to be reversed, or the check valve 104 will need to be replaced. The check valve 104 may be located at any desired distance from the impeller 42 to prevent interference with the rotation of the impeller 42 during use. The check valve 104 may be positioned proximate to the base 68, immediately to the exterior of the base 68, or may act as a bottom surface for the cartridge style hydraulic flow sensor 20.

FIG. 6 also identifies the electrical communication between the Hall Effect Sensor 52 and the circuit board 48 and transmitter 38.

In at least one embodiment as shown in FIG. 7, a hydraulic circuit manifold 56 includes a number of cavities 54 each of which being in fluid flow communication with a fluid flow conduit traversing hydraulic circuit manifold 56 in any desired direction.

In another alternative embodiment as depicted in FIG. 8, a schematic diagram of a hydraulic system 84 is shown when a cartridge style hydraulic flow sensor is in fluid flow communication with a valve 96 within a hydraulic circuit manifold 56. The valve 96 may be in electric and in communication with a remote controller/processor 76 to regulate an operational status of the hydraulic system 84. In the embodiment shown in FIG. 8, the valve 96 is in communication with an actuator 98 which in turn is in communication with remote controller/processor 76. A command signal is transmitted from the remote controller/processor 76 for receipt by the actuator 98. The actuator 98 in turn opens, increases the opening, decreases the opening and/or closes the valve 96 in response to the received command signal.

In the embodiment depicted in FIG. 8, the hydraulic circuit manifold 56 and valve 96 are in fluid flow communication with a filter 100 and a bypass valve 102. The remote controller/processor 76 may be in communication with the bypass valve 102 in order to regulate the opening, partial opening, partial closing and/or closing of the bypass valve 102.

In the embodiment depicted in FIG. 8 a cartridge style hydraulic flow sensor 20 is in fluid flow communication with the filter 100 and the bypass valve 102 and/or the valve 96, and hydraulic circuit manifold 56, for receipt of fluid flow from any number of fluid flow conduits.

In the embodiment depicted in FIG. 8, the volume of fluid flow bypassing the filter 100 is an indication of the condition of the filter element. The more a filter element gets saturated with contaminants that are being removed from the fluid by the filter 100, the higher the rate of flow across the bypass valve 102. In this application, the cartridge style hydraulic flow sensor 20 can accurately monitor the is condition of the filter element, insuring that the element is either still effective, or requires replacement.

In another alternative embodiment as depicted in FIG. 9, a pump 86 is in fluid flow communication with a cartridge style hydraulic flow sensor 20. The cartridge style hydraulic flow sensor 20 may additionally be in communication with a valve 96 of a hydraulic circuit manifold 56 and a remote controller/processor 76. The valve 96 of the hydraulic circuit manifold 56 is in communication with a actuator 98. The valve 96 regulates the opening, partial opening, partial closing and/or closing of the valve 96 of the hydraulic circuit manifold 56. The actuator 98 is in communication with the remote controller/processor 76 and will receive a command signal from the remote controller/processor 76 directing the modification of the operational status of the valve 96.

In another alternative embodiment as depicted in FIG. 10, a pump 86 is in fluid flow communication with a cartridge style hydraulic flow sensor 20 as part of a hydraulic circuit manifold 56. Alternatively, the cartridge style hydraulic flow sensor 20 may be directly plumbed into a hydraulic line. The cartridge style hydraulic flow sensor is in communication with the remote controller/processor 76 which may, be used to monitor the operational status of the hydraulic system 84 and to issue a communication signal to an operator in the event that the status of a hydraulic system 84 moves outside of an acceptable operational parameter. Alternatively, the remote controller/processor 76 may automatically send command signals to the pump 86 to maintain the operational status of hydraulic system 84 as sensed by the cartridge style hydraulic flow sensor 20.

The cartridge style hydraulic flow sensor 20 may be used as a component in a hydraulic system 84 which may have the representative function of monitoring hydraulic flow output; monitoring flow within a steering or break system for a vehicle; monitoring flow across a relief valve; or monitoring flow in a pump case drain. The above uses have been provided for illustrative purposes and should in no w ay be considered as limiting of the available uses of a cartridge style hydraulic flow sensor 20 within a fluid system or machine.

It should be noted that the hydraulic system 84 depicted in FIG. 8 through FIG. 10 represent an extremely small number of examples of the almost infinite number of hydraulic systems 84 which may include the use of a cartridge style hydraulic flow sensor 20 to monitor and signal the status of fluid flow through fluid flow conduits. The examples identified in FIG. 8 through FIG. 10 are not to be construed as in any way limiting of the use of the cartridge style hydraulic flow sensor 20.

Figure 11:
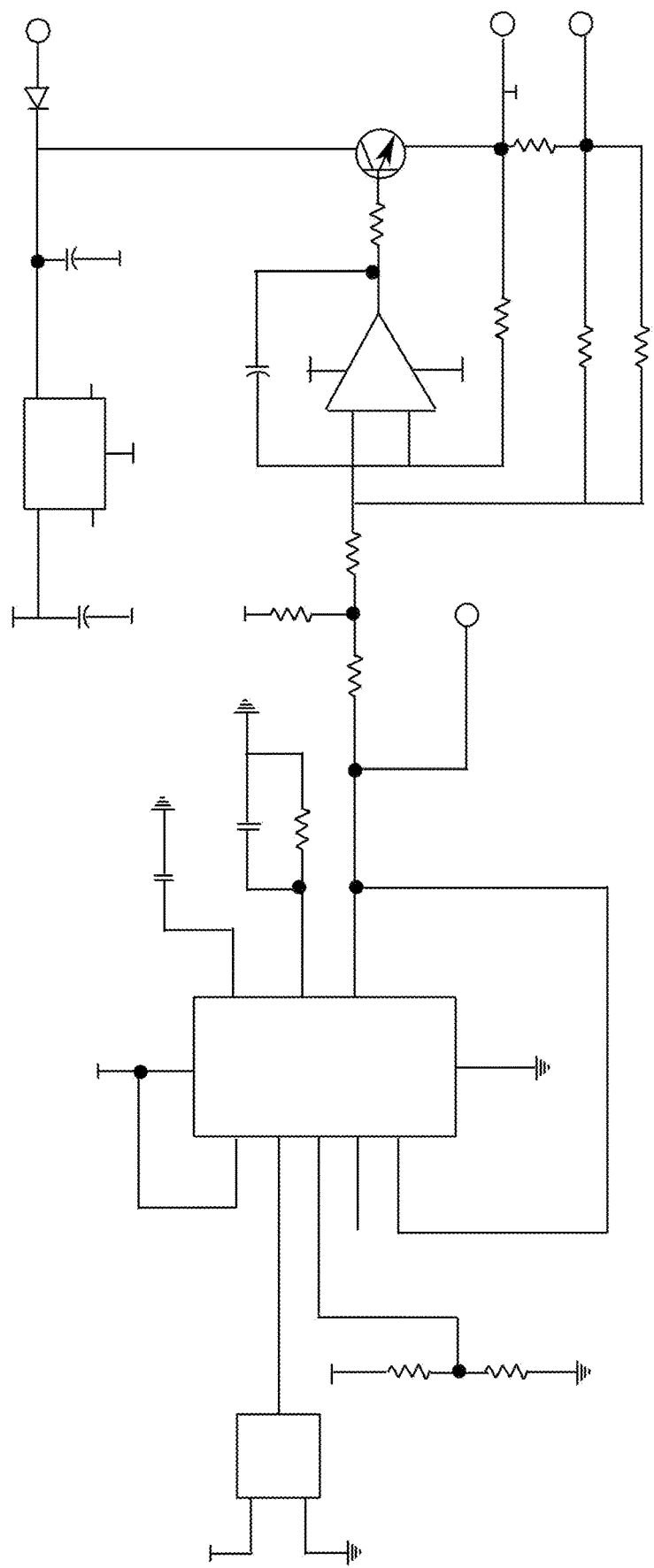
FIG. 11 is a circuit diagram of the electronic circuit of one alternative embodiment of the cartridge style hydraulic flow sensor.

In one alternative embodiment, a circuit diagram is provided for the cartridge style hydraulic flow sensor 20 in FIG. 11. In one embodiment of the circuit used in the cartridge style hydraulic flow sensor 20, electrical pulse signals are converted from the Hall Effect Sensor 52 into a 4-20 milliamp output, which is also the wavelength of a common control signal.

In another alternative embodiment, the cartridge style hydraulic flow sensor 20 includes a pressure sensor 106 within the interior of the cylindrical casing 66. Alternatively, the pressure sensor 106 may be disposed on the exterior of the cylindrical casing 66 proximate to the base 68. The pressure sensor 106 is in communication with the circuit board 48 and transmitter 38 which will control the communication of a detected pressure within the hydraulic circuit manifold 56 or fluid conduit 108 to the remote controller/processor 76.

In one embodiment, following the receipt of the detected fluid pressure from the transmitter 38, the remote controller/processor 76 may manually or automatically disengage or activate a pump 86, or other component of a hydraulic system 84. In the event that the remote controller/processor 76 determines that the detected fluid pressure within the fluid conduit 108 or hydraulic circuit manifold 56 is abo % e or below a desired fluid pressure, then the remote controller/processor 76 may automatically alter the status of a component of a hydraulic system 84 to increase or to decrease the fluid pressure within the fluid conduit 108 or hydraulic circuit manifold 56 to a desired level.

In another alternative embodiment, the cartridge style hydraulic flow sensor 20 includes a temperature sensor 110. The temperature sensor 110 may be located within the interior of the cylindrical casing 66. Alternatively, the temperature sensor 110 may be disposed on the exterior of the cylindrical casing 66 proximate to the base 68. The temperature sensor 110 is in communication with the circuit board 48 and transmitter 38 which will control the communication of a detected temperature within the hydraulic circuit manifold 56 or fluid conduit 108 to the remote controller/processor 76.

In one embodiment, following the receipt of the detected temperature of the fluid from the transmitter 38, the remote controller/processor 76 may manually or automatically engage or disengage a component to improve the operation of the hydraulic system 84. In the event that the remote controller/processor 76 determines that the detected fluid temperature within the fluid conduit 108 or hydraulic circuit manifold 56 is above or below a desired fluid temperature, then the remote controller/processor 76 may automatically alter the status of a component of a hydraulic system 84 to increase or to decrease the fluid temperature within the fluid conduit 108 or hydraulic circuit manifold 56 to a desired level.

In at least one embodiment, sufficient electrical shielding is present between the circuit board 48, transmitter 38, Hall Effect Sensor 52, electronic coupler 64, leads 72, pressure sensor 106 and temperature sensor 110 to prevent electrical interference or feedback between the Hall Effect Sensor 52, pressure sensor 106 and temperature sensor 110 eliminating erroneous fluid flow, pressure and/or temperature measurements.

In at least one embodiment, the invention does not require that a fluid conduit 108 be cut or breached in order to insert a cartridge style hydraulic flow sensor into, and the re-plumbing of, a fluid conduit 108. The cartridge style hydraulic flow sensor 20 is replaceable, removable and easily coupled within a cavity 54 of a hydraulic circuit manifold 56.

It should be noted that in one or more embodiments the materials selected to form the cartridge style hydraulic flow sensor 20 may vary. In some embodiments the cartridge style hydraulic flow sensor 20 may be formed of plastic material, metal materials such as steel or stainless steel materials, composite materials, coated materials, and other materials and combinations of materials dependent upon optimal performance considerations based on the overall size of the cartridge style hydraulic flow sensor 20 to be used and the types of fluid to pass through the cartridge style hydraulic flow sensor 20. I should be noted that the material selected to form the cartridge style hydraulic flow sensor 20 will not rust, decay or degrade and fail to operate for the intended purpose when used with a variety of fluids, even where some of the fluids are corrosive to some types of materials. It should also be noted that any particular component may be formed of any desired material for use in the cartridge style hydraulic flow sensor 20, and not all or the components are required to be formed of an identical material.

It should be noted that in one or more embodiments the fluids to be monitored by the cartridge style hydraulic flow sensor 20 are not restricted to hydraulic (fluid power) applications. The cartridge style hydraulic flow sensor 20 may be easily utilized in any type of fluid conveying system, where monitoring the rate of fluid flow is desirable. Some limited examples of the types of fluids may include water based fluids, oil based fluids, flammable fluids, and chemical based fluids to name a few of the numerous types of fluids to be monitored within a fluid system.

In a first embodiment, a cartridge hydraulic flow sensor includes a cylindrical casing having an exterior, an interior, a head, and a base, the casing having a first port and a second port through the casing, the first port and the second port permitting a fluid to flow into the interior and out of the interior, the first port being proximate to the base and the second port being between the head and the first port; a sensor is disposed in the interior, the sensor being proximate to the second port, the sensor detecting a number of revolutions of a rotatable impeller rotating about a shaft during a period of time; the shaft having a first end, the shaft being disposed centrally within the interior and extending away from the sensor; the rotatable impeller being engaged to the first end, the impeller revolving about the shaft following contact with the flow of the fluid; and an electric coupler having a transmitter is in communication with the sensor, the electric coupler being engaged to the head, wherein the sensor communicates to the transmitter the detected number of revolutions of the impeller about the shaft during the period of time, the transmitter being in communication with a controller, the transmitter communicating to the controller the detected number of revolutions of the impeller about the shaft.

In a second alternative embodiment according to the first embodiment, the sensor includes at least one magnet.

In a third alternative embodiment according to the second embodiment, the cartridge flow sensor is releasably secured within a cavity of a hydraulic circuit manifold.

In a fourth alternative embodiment according to the third embodiment, the flow of the fluid enters into the interior through the first port.

In a fifth alternative embodiment according to the third embodiment, the flow of the fluid enters into the interior through the second port.

In a sixth alternative embodiment according to the third embodiment, the exterior includes threads, wherein the threads secure the cartridge casing within the cavity of the hydraulic circuit manifold.

In a seventh alternative embodiment according to the third embodiment, the sensor includes a circuit board.

In an eighth alternative embodiment according to the seventh embodiment, the electric coupler is engaged to a platform, the head having a ledge, the platform being supported by the ledge.

In a ninth alternative embodiment according to the eighth embodiment, the electric coupler has leads, the leads providing communication between the transmitter and the controller.

In a tenth alternative embodiment according to the ninth embodiment, the sensor is a Hall Effect Sensor.

In an eleventh alternative embodiment according to the tenth embodiment, the invention includes a check valve, the check valve being disposed proximate to the base, the check valve restricting the flow of the fluid to a single direction within the interior.

In a twelfth alternative embodiment according to the eleventh embodiment, the invention includes a pressure sensor, the pressure sensor being disposed in the interior, the pressure sensor being in communication with the transmitter, the pressure sensor detecting fluid pressure within a fluid conduit.

In a thirteenth alternative embodiment according to the twelfth embodiment, the invention includes a temperature sensor, the temperature sensor being disposed in the interior, the temperature sensor being in communication with the transmitter, the temperature sensor detecting a temperature of the fluid within the interior.

In a fourteenth alternative embodiment according to the thirteenth embodiment, the transmitter communicates to the controller at least two of the detected number of revolutions of the impeller about the shaft, the detected fluid pressure within a fluid conduit, and the detected temperature of the fluid within the interior.

In a fifteenth alternative embodiment according to the fourteenth embodiment, the controller determines a rate of fluid passage within the interior and the controller communicates at least one of the rate of fluid passage, the detected fluid pressure within a fluid conduit, and the detected temperature of the fluid within the interior to an operator.

In a sixteenth alternative embodiment according to the fifteenth embodiment, the controller automatically communicates a command signal to at least one component of a hydraulic system for modification of at least one of the rate of fluid passage, the detected fluid pressure within a fluid conduit, and the detected temperature of the fluid within the interior.

In a seventeenth alternative embodiment a cartridge hydraulic flow sensor includes a cylindrical casing having an exterior, an interior, a head, and a base, the casing having a first port and a second port through the casing, the first port and the second port permitting a fluid to flow into the interior and out of the interior, the first port being proximate to the base and the second port being between the head and the first port; a sensor engaged to the head, the sensor detecting a number of revolutions of a rotatable impeller rotating a shaft during a period of time; the shaft having a first end and a second end, the shaft being disposed centrally within the interior; the rotatable impeller being engaged to the first end, the impeller revolving the shaft following contact with the flow of the fluid; a gear engaged to the second end, the gear having a magnetic material, the sensor being proximate to the gear, the shaft rotating the gear relative to the sensor; and an electric coupler having a transmitter in communication with the sensor, the electric coupler being engaged to the head, wherein the sensor communicates to the transmitter the detected number of revolutions of the gear during the period of time, the transmitter being in communication with a controller, the transmitter communicating to the controller the detected number of revolutions of the gear during the period of time.

This completes the description of the preferred and alternate embodiments of the invention. Those skilled in the art may recognize other equivalents to the specific embodiment described herein which equivalents are intended to be encompassed by the claims attached hereto.

The above disclosure is intended to be illustrative and not exhaustive. This description will suggest many variations and alternatives to one of ordinary skill in this art. The various elements shown in the individual figures and described above may be combined or modified for combination as desired. All these alternatives and variations are intended to be included within the scope of the claims where the term "comprising" means "including, but not limited to".

These and other embodiments which characterize the invention are pointed out with particularity in the claims annexed hereto and forming a part hereof. However, for further understanding of the invention, its advantages and objectives obtained by its use, reference should be made to the drawings which form a further part hereof and the accompanying descriptive matter, in which there is illustrated and described embodiments of the invention.

With respect to the above description, it is to be realized that the optimum dimensional relationships for the parts of the invention, to include variations in size, materials, shape, form, function and manner of operation, assembly and use, are deemed to be within the expertise of those skilled in the art, and all equivalent structural variations and Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A cartridge hydraulic flow sensor comprising:
   a cylindrical casing comprising an exterior, an interior, a head, and a base, said casing having a first port and a second port through said casing, said first port and said second port permitting a fluid to flow into said interior and out of said interior, said first port being proximate to said base and said second port being between said head and said first port;
   a sensor disposed in said interior, said sensor being proximate to said second port, said sensor detecting a number of revolutions of a rotatable impeller rotating about a shaft during a period of time;
   said shaft having a first end, said shaft being disposed centrally within said interior and extending away from said sensor;
   said rotatable impeller being engaged to said first end, said impeller revolving about said shaft following contact with said flow of said fluid; and
   an electric coupler having a transmitter in communication with said sensor, said electric coupler being engaged to said head,
   wherein said sensor communicates to said transmitter said detected number of revolutions of said impeller about said shaft during said period of time, said transmitter being in communication with a controller, said transmitter communicating to said controller said detected number of revolutions of said impeller about said shaft, and further wherein said sensor is constructed and arranged for insertion into a cavity of a manifold, said cavity being in fluid flow communication with a manifold conduit, said head being proximate to a manifold exterior and said base being disposed in a manifold interior, said first port and said second port being in fluid flow communication with said manifold conduit.

2. The cartridge hydraulic flow sensor according to claim 1, said sensor comprising at least one magnet.

3. The cartridge hydraulic flow sensor according to claim 2, wherein said sensor is releasably secured within said cavity of said manifold.

4. The cartridge hydraulic flow sensor according to claim 3, wherein said flow of said fluid enters into said interior through said first port.

5. The cartridge hydraulic flow sensor according to claim 3, wherein said flow of said fluid enters into said interior through said second port.

6. The cartridge hydraulic flow sensor according to claim 3, wherein said exterior comprises threads, wherein said threads secure said cylindrical casing within said cavity.

7. The cartridge hydraulic flow sensor according to claim 3, said sensor comprising a circuit board.

8. The cartridge hydraulic flow sensor according to claim 7, wherein said electric coupler is engaged to a platform, said head having a ledge, said platform being supported by said ledge.

9. The cartridge hydraulic flow sensor according to claim 8, said electric coupler having leads, said leads providing communication between said transmitter and said controller.

10. The cartridge hydraulic flow sensor according to claim 9, said sensor being a Hall Effect Sensor.

11. The cartridge hydraulic flow sensor according to claim 10, further comprising a check valve, said check valve being disposed proximate to said base, said check valve restricting said flow of said fluid to a single direction within said interior.

12. The cartridge hydraulic flow sensor according to claim 11, further comprising a pressure sensor, said pressure sensor being disposed in said interior, said pressure sensor being in communication with said transmitter, said pressure sensor detecting fluid pressure within said manifold conduit.

13. The cartridge hydraulic flow sensor according to claim 12, further comprising a temperature sensor, said temperature sensor being disposed in said interior, said temperature sensor being in communication with said transmitter, said temperature sensor detecting a temperature of said fluid within said interior.

14. The cartridge hydraulic flow sensor according to claim 13, wherein said transmitter communicates to said controller at least two of said detected number of revolutions of said impeller about said shaft, said detected fluid pressure within said manifold conduit, and said detected temperature of said fluid within said interior.

15. The cartridge hydraulic flow sensor according to claim 14, wherein said controller determines a rate of fluid passage within said interior and said controller communicates at least one of said rate of fluid passage, said detected fluid pressure within said manifold conduit, and said detected temperature of said fluid within said interior to an operator.

16. The cartridge hydraulic flow sensor according to claim 15, wherein said controller automatically communicates a command signal to at least one component of a hydraulic system for modification of at least one of said rate of fluid passage, said detected fluid pressure within said manifold conduit, and said detected temperature of said fluid within said interior.

17. A cartridge hydraulic flow sensor comprising:
   a cylindrical casing comprising an exterior, an interior, a head, and a base, said casing having a first port and a second port through said casing, said first port and said second port permitting a fluid to flow into said interior and out of said interior, said first port being proximate to said base and said second port being between said head and said first port;
   a sensor engaged to said head, said sensor detecting a number of revolutions of a rotatable impeller rotating a shaft during a period of time;

said shaft having a first end and a second end, said shaft being disposed centrally within said interior;

said rotatable impeller being engaged to said first end, said impeller revolving said shaft following contact with said flow of said fluid;

a gear engaged to said second end, said gear having a magnetic material, said sensor being proximate to said gear, said shaft rotating said gear relative to said sensor; and an electric coupler having a transmitter in communication with said sensor, said electric coupler being engaged to said head, wherein said sensor communicates to said transmitter said detected number of revolutions of said gear during said period of time, said transmitter being in communication with a controller, said transmitter communicating to said controller said detected number of revolutions of said gear during said period of time, and further wherein said sensor is constructed and arranged for insertion into a cavity of a manifold, said cavity being in fluid flow communication with a manifold conduit, said head being proximate to a manifold exterior and said base being disposed in a manifold interior, said first port and said second port being in fluid flow communication with said manifold conduit.

* * * * *